United States Patent [19]

Lis

[11] Patent Number: 4,506,005

[45] Date of Patent: Mar. 19, 1985

[54] METHOD OF CATALYTIC ETCHING

[75] Inventor: Steven A. Lis, Needham, Mass.

[73] Assignee: GCA Corporation, Bedford, Mass.

[21] Appl. No.: 493,151

[22] Filed: May 10, 1983

[51] Int. Cl.³ ............................................ G03C 5/00
[52] U.S. Cl. ................................. 430/317; 430/313; 430/323; 156/628; 156/643; 156/646; 427/43.1
[58] Field of Search ...................... 156/628, 643, 646; 430/313, 317, 323, 326, 330; 427/43.1

[56] References Cited

U.S. PATENT DOCUMENTS

| | | | |
|---|---|---|---|
| 3,999,990 | 12/1976 | Janai et al. | 430/313 |
| 4,127,437 | 11/1978 | Bersin et al. | 156/635 |
| 4,252,891 | 2/1981 | Kostyshin et al. | 430/323 |
| 4,320,191 | 3/1982 | Yoshikawa et al. | 430/296 |
| 4,368,099 | 1/1983 | Huggett et al. | 156/628 |
| 4,371,608 | 2/1983 | Das | 430/315 |
| 4,405,710 | 9/1983 | Balasubramanyam et al. | 430/311 |
| 4,434,217 | 2/1984 | Masters et al. | 430/9 |
| 4,454,221 | 6/1984 | Chen et al. | 430/316 |

OTHER PUBLICATIONS

Yoshikawa et al., "A Novel Inorganic Photoresist Utilizing Ag Photodoping in Se–Ge Glass Films", Applied Physics Letters, vol. 29(10), 1976, pp. 677–679.

J. W. Coburn, "Plasma Etching and Reactive Ion Etching", AVS Monograph Series Article, pp. 38 and 40, (1982).

*Primary Examiner*—John E. Kittle
*Assistant Examiner*—José G. Dees
*Attorney, Agent, or Firm*—Henry D. Pahl, Jr.

[57] ABSTRACT

Catalytic etching is carried out by placing a pattern of a catalyst on a surface to be selectively etched and treating the imaged surface with an activated fluid which consumes the material being etched. In one embodiment a surface such as a chalcogenide is provided with a silver or other metal pattern corresponding to a semiconductor pattern and the chalcogenide is etched with an oxygen containing plasma reactive with the chalcogenide, the reaction being increased by the silver to provide a positive resist.

6 Claims, No Drawings

METHOD OF CATALYTIC ETCHING

BACKGROUND OF THE INVENTION

In various fields of art and technology there is need to remove or react a material in selected and selective areas. Such selective action is used in etching in the production of decorative patterns, in the formation of information patterns and in industrial production and in diverse uses and applications. In one application of the formation of information patterns in industrial production a so-called high technology use and application in semiconductor manufacture has put a severe strain on the ability to form these patterns rapidly, effectively, to result in practical and useful procedures for creating particularly high quality fine resolution patterns of material. In micro-electronics industries such as the production of semiconductors it is usual to form a pattern of a desired electronic circuit or desired semiconductor element on a surface and selectively remove material to form a resist layer whose fineness of definition is in the order of the wave length of light or substantially finer than the wave length of light.

One such procedure is known in the art as microlithography, terminology derived from classical lithography which it resembles. In this procedure as now practiced, a layer of material such as a chalcogenide on a suitable substrate is treated photographically with a pattern of activating radiation to form a selectively etchable chalcogenide which, when etched, is employed as a lithographic mask or resist for semiconductor element production. One photo-activating mechanism in such procedures is known in the art as photo-doping or silver-doping in which a silver image is driven into the chalcogenide surface and acts to "cap" or protect the silver-containing areas against etching. According to Yoshikawa U.S. Pat. No. 4,127,414 a pattern of silver is driven into the chalcogenide surface by a pattern of driving radiation; according to Masters et al. U.S. Pat. No. 4,269,935 a pattern of silver is formed on the chalcogenide surface by photographic exposure and processing of a silver halide deposit and this silver pattern is driven into the chalcogenide by flooding with driving radiation. In either way, a silver protective cap is formed, protecting the chalcogenide against the etch to produce a negative resist. For the resist formation the chalcogenide can be etched with an aqueous alkali or other solution to dissolve the unprotected chalcogenide on the substrate; freon plasma etching has also been used.

Various improvements in such systems are desirable. First, it is desirable to produce photographically positive rather than photographically negative images or relief layers in which the areas removed from the chalcogenide resist are those which are exposed to radiation rather than those which are unexposed. Also, greater uniformity of etched lines is desired so that increased fineness of resolution can be achieved. Further, in semiconductor manufacture and in virtually all other photo-exposure systems it is desired to generate systems having greater light or radiation sensitivity, and efforts to improve photographic speed in virtually all light or radiation-responsive systems have been going on for many, many decades.

GENERAL NATURE OF THE INVENTION

A material which is ordinarily relatively stable in ambient conditions and which exists in solid or glassy phase is consumed in selected and selective areas, or etched in a pattern, by reaction with an activated fluid reaction material. A catalytic agent such as a heavy metal as silver or the like in finely divided or elemental form is placed on or inside the surface of the material in an image or pattern configuration and acts to increase or to catalyze the reaction in the catalyst-containing areas, with the result that the material is selectively etched or removed in these catalyst areas. The reactive fluid may be thermally activated, may be electrically activated as in a plasma, or may be otherwise activated as desired. The metal or other catalyst in the image areas increases the etching rate and appears to act as a catalyst for the etching reaction, thus acting as an in situ catalyst in the image areas.

In one embodiment of the invention wherein the invention is employed for the production of semiconductor elements, a resist material such as arsenic trisulfide or other chalcogenide is coated on a suitable substrate and a metal such as silver is photo-doped into the resist layer in image areas corresponding to a desired semiconductor element pattern desired on a chip. Such photo-doping may be accomplished in known ways such as by driving a silver layer into a chalcogenide surface selectively in image pattern areas as disclosed for example in Yoshikawa U.S. Pat. No. 4,127,414 and other procedures well known in the art, or by the procedure of Master et al. U.S. Pat. No. 4,269,935, or in other ways in which an image is formed in the surface. These procedures now well known in the art have the common characteristics that they form a protective layer or "cap" so that the areas exposed to radiation are better protected against a general class of etching, thus producing a negative resist.

In one form of the present invention a suitable image of a metal is formed and may, if desired, by photo-doped into the chalcogenide surface. The preferred embodiment of the invention as now understood employs silver-doping to form a silver image in the chalcogenide surface. The doped chalcogenide layer is then etched with an activated etching fluid to react with and remove the chalcogenide in the silver-containing image area rather than in the regions that are not silvered as is the case with prior art methods. Excellent results have been realized with plasma etching employing oxygen plasma or oxygen-nitrogen mixture plasma.

The system according to the present invention produces the more desirable photographically positive relief image rather than the photographically nagative image produced in most prior art methods, and forms relief patterns judged to be better than those of prior systems, forming such excellent patterns upon exposures to radiation of a fraction of the time and intensity required by prior methods.

Under the desired reaction conditions the reaction of the etching fluid or plasma on the chalcogenide proceeds selectively, or selectively faster, in areas containing the image of silver or other metal, thus indicating a catalyzed reaction. The reaction may employ a plasma of reactive gas, such as an oxygen plasma, an oxygen-nitrogen plasma or the like, or may employ an activated etch fluid such as a thermally activated gas or liquid including oxidizing agents.

The present invention differs from prior art procedures in that it produces both the opposite result and a better result. According to the prior art, a silver or other protective cap on a chalcogenide such as $As_2S_3$ acts to protect the chalcogenide from etching, forming a negative image; in the present invention the same or similar material image in or on the chalcogenide expedites the etching chemical reaction. The reaction products are volatilized under the reaction conditions. As the reaction continues, the silver atoms remain in the image area, moving inwardly in the $As_2S_3$ layer and continuing to expedite the reaction in these areas. As a consequence a small quantity of silver atoms or ions results in a substantially complete etch.

SPECIFIC DESCRIPTION OF THE INVENTION

The following examples illustrate procedures for selective etching to form resist patterns on a chalcogenide layer suitable for production of semiconductor elements.

EXAMPLE 1

A thin layer of a polymer is placed on a silicon wafer. In this Example, a layer about one micrometer thick was coated on a silicon surface by conventional procedures, employing polymethyl methacrylate as the polymer. The polymer coated wafer was placed in a high vacuum evaporator which was evacuated to vacuum in the range of $1 \times 10^{-4}$ to $1 \times 10^{-8}$ Torr. A layer of about 600 A of arsenic trisulfide was then vacuum evaporated onto the polymer coating. Without breaking the vacuum, a layer of about 100 A of metallic silver was then vacuum evaporated onto the $As_2S_3$ surface. The coated wafer was then removed from the evaporator and exposed through a lithographic mask to generate a high resolution image on the surface of the wafer. An exposure of 30 millijoules was used. As is known in the art, there resulted a wafer having a silver image of the type known as a photo-doped image embedded or doped into the chalcogenide.

A solution was prepared of 0.1M potassium ferricyanide and 0.1M potassium bromide. The wafer was dipped in this solution about one minute, washed in water and dipped in concentrated hydrochloric acid for one minute and again washed.

The wafer was then placed in a plasma etcher; the etcher employed was a "Plasmod" device, manufactured by Tegal Corporation. Oxygen-nitrogen (50/50) gas of purity about 99.9% at a pressure of about 1 Torr and a power level of about 25 watts was used to direct a hydrogen plasma onto the wafer. After about 2 minutes the plasma was halted and the wafer removed from the etcher.

The wafer had an etched relief image of $As_2S_3$ material, the $As_2S_3$ corresponding to the wafer areas which had not been exposed to the radiation thus representing a photographically positive image.

EXAMPLE 2

Procedure of example 1 was repeated except that instead of a plasma etching gas, a liquid etchant consisting of 500 ml of $H_2O$
50 g of $K_2S_2O_8$
acidify to pH=1.0 using $HNO_3$.

After 2 minutes a positive image was again developed.

The catalytic material may be any that expedites or catalyzes the desired reaction, usually a metallic element or ion. For example, silver is the presently preferred catalytic material for etching a chalcogenide layer for semiconductor production. Silver can readily be formed into a pattern by forming a radiation-responsive silver-containing layer such as a silver halide layer or a silver layer on a suitable silver-compatible surface which is being etched. In the semiconductor industry, for example, it is known that silver may be doped into a chalcogenide layer on a semiconductor wafer by radiation, forming a silver combination with the chalcogenide. Other metals also may be radiation-doped into a chalcogenide, such as tin, copper, platinum, palladium or the like, or may be placed on an image of another metal so doped into the layer. All these metallic atoms or ions can catalyze a desired etching.

In the presently preferred embodiment of the invention, as previously indicated, a lithographic layer on an element in the semiconductor device is etched, forming an etched pattern having a resolution in the order of less than one micron and generally in the order of a half micron or less. Lithographic layers in use in the semiconductor electronics industry include various chalcogenides such as arsenic trisulfide, germanium-selenium and the like. Various metals such as copper, tin and the like can be photo-doped into the chalcogenide and like layers, but silver has the twin advantage of being readily doped into the layers and of being formed in a chalcogenide in response to a very low level of patterned radiation. A silver-doped chalcogenide is excellent for the present invention and is the imaged material of Examples 1 and 2.

Etching fluids for the present invention are gases or liquids which can be energized or activated and which, when activated, react with the selected etch surface to consume the material in a chemical reaction. Plasmas such as $O_2$ plasma and $O_2/N_2$ plasma are presently preferred. These plasmas are activated or electrostatically charged gases which flow in a controlled direction. They are easily formed into a plasma and react with the preferred $As_2S_3$ chalcogenide to form volatile reaction products. For the semiconductor industry, they produce extremely fine resolution patterns. When used on photo-doped $As_2S_3$ layers wherein an image has been formed by means known in the art by photo-doping a silver layer exposed to about 30 millijoules radiation, excellent etched patterns are formed; this compares with patterns formed by plasma etching with $CF_4$ wherein the silver cap protects rather than catalyzing the action of the plasma and forms photographically negative rather than positive relief patterns and which require several times the radiation intensity for roughly equal etch clarity.

If desired, post imaging treatment may be employed within the scope of the invention. These treatments and other etchable layers and other thermally or electrically activated etch reagents will of course be apparent to those skilled in the art.

I claim:

1. In the production of semiconductor elements, a method of etching a chalcogenide layer on a semiconductor substrate comprising
   providing a chalcogenide layer on a semiconductor substrate;
   over said chalcogenide layer, providing a layer including a metal which catalyzes oxidizing reactions of said chalcogenide;
   exposing said coated substrate to radiant energy in a desired pattern thereby to drive some of said metal into said chalcogenide in correspondence with said pattern;

removing the overlying metal including layer, leaving the metal embedded in said chalcogenide;

generating a plasma of a gas reactive with said chalcogenide in an oxidizing reaction catalyzed by said catalyst to consume said chalcogenide, and directing said plasma to the surface of said chalcogenide, whereby said plasma reacts with said chalcogenide preferentially in the areas of said imbedded catalyst metal to selectively etch the chalcogenide in said areas to form a positive resist pattern over said semiconductor substrate.

2. The method of claim 1 wherein said catalyst is an elemental metal.

3. The method of claim 1 wherein said catalyst is silver.

4. The method of claim 2 wherein said catalyst is silver embedded in the chalcogenide surface and said plasma is oxygen gas.

5. The method of claim 2 wherein said catalyst is silver embedded in the chalcogenide surface and said plasma is a mixture of oxygen and nitrogen (50/50) gas mixture.

6. A method of producing semiconductor electronic devices comprising:

providing a polymer layer on a semiconductor substrate;

over said polymer layer, providing a layer of arsenic trisulfide;

over said arsenic trisulfide layer, providing a layer of silver;

exposing said coated substrate to radiant energy in a desired pattern thereby to drive some of said silver into said arsenic trisulfide in correspondence with said pattern;

removing the overlying metal including layer leaving the metal embedded in said arsenic trisulfide;

generating a plasma of a gas reactive in an oxidizing reaction catalyzed by said catalyst; and directing said plasma to the surface of said chalcogenide, whereby said plasma reacts with said arsenic trisulfide preferentially in the areas of said imbedded silver to selectively etch the chalcogenide in said areas to form a positive resist pattern over said semiconductor substrate.

* * * * *